United States Patent [19]

Motegi et al.

[11] Patent Number: 4,843,254

[45] Date of Patent: Jun. 27, 1989

[54] MASTER-SLAVE FLIP-FLOP CIRCUIT WITH THREE PHASE CLOCKING

[75] Inventors: Hisatoshi Motegi; Akira Nomura, both of Tokyo, Japan

[73] Assignee: Oki Electric Industry Co., Ltd., Tokyo, Japan

[21] Appl. No.: 162,226

[22] Filed: Feb. 29, 1988

[30] Foreign Application Priority Data

Mar. 2, 1987 [JP] Japan .................................. 62-47064

[51] Int. Cl.$^4$ ...................... H03K 3/284; H03K 3/26; H03K 21/16
[52] U.S. Cl. ................................ 307/272.2; 307/269; 307/279; 307/481; 377/79; 377/117
[58] Field of Search .................. 307/272.1, 272.2, 279, 307/289, 481, 269, 452, 453; 377/79, 105, 117

[56] References Cited

U.S. PATENT DOCUMENTS

| | | | |
|---|---|---|---|
| 3,993,916 | 11/1976 | Copeland, III et al. | 377/79 |
| 4,420,695 | 12/1983 | Fisher | 307/481 |
| 4,495,628 | 1/1985 | Zasio | 307/272.2 |
| 4,540,903 | 9/1985 | Cooke et al. | 307/481 |
| 4,667,339 | 5/1987 | Tubbs et al. | 307/272.2 |

OTHER PUBLICATIONS

"Fundamentals of Semiconductor Integrated Circuits", Japan–Feb. 20, 1986, Published by Baifukan, p. 267.
Principles of CMOS VLSI Design, p. 213; Addison-Wesley Publishing Company, 1985.

*Primary Examiner*—Stanley D. Miller
*Assistant Examiner*—Timothy P. Callahan
*Attorney, Agent, or Firm*—Spencer & Frank

[57] ABSTRACT

A master-slave flip-flop circuit includes a master circuit switching element controlled by a first clock signal for controlling transfer of data from an input terminal to a master circuit data holding element which holds data transferred through the master circuit switching element, and a slave circuit switching element controlled by a second clock signal for controlling transfer of data from the master circuit data holding element to a slave circuit data holding element which holds data transferred through the slave circuit switching element. The first clock signal is nearly in phase with, but lags a little behind, the second clock signal.

10 Claims, 4 Drawing Sheets

MASTER-SLAVE FLIP-FLOP CIRCUIT WITH THREE PHASE CLOCKING

BACKGROUND OF THE INVENTION

The present invention relates to a master-slave flip-flop circuit and a clock control circuit for supplying clock signals to the master-slave flip-flop circuit.

A flip-flop circuit is a type of data storage element and stores data input in synchronism with a clock signal supplied from a clock control circuit. This type of circuit is often used in a register or counter in a microprocessor and the like.

Master-slave flip-flop circuits, which are one type of flipflop circuit, comprise a master circuit and a slave circuit and are controlled by a clock signal whose one cycle comprises data transfer from an input terminal to a data holding element of the master circuit, data holding by a data holding element of the master circuit and data transfer from the data holding element of the master circuit to the data holding element of the slave circuit, and data holding by the data holding element of the slave circuit. The output state is changed at input of an edge of a signal at which data holding in the master circuit is initiated.

Examples of such master-slave flip-flop circuits are shown in (a) "Fundamentals of Semiconductor Integrated Circuits" First Edition, published by Baifukan, Japan (Feb. 20, 1986), page 267 and (b) "Principals of CMOS VLSI Design" Addison - Wesley Publishing Company, U.S.A. (1985), page 213.

The example of the prior art master-slave flip-flop circuit which is shown in the aforementioned article (a) has a problem in that it may function erroneously due to skew in the clock signals. The skew in the clock signals is a time lag between a clock signal and an inverted clock signal that is introduced by an inverter through which a clock signal (or an inverted clock signal) is passed to produce an inverted clock signal (or an uninverted clock signal).

An example of the prior art master-slave flip-flop circuit which is shown in the aforementioned article (b) attempts to solve the aforementioned problem by using a transfer gate having the same delay time as an inverted and providing inverted and uninverted clock signals at the outputs of the inverter and the transfer gate. But it is difficult to maintain the delay time of the transfer gate exactly equal to the delay time of the inverter irrespective of varying environmental conditions, such as temperature. This means the operation margin is limited. Moreover, a transfer gate does not have driving power. Restriction on the fan-out is therefore severe. This means the amount of hardware, particularly the clock control circuitry per flip-flop circuit, is increased.

SUMMARY OF THE INVENTION

An object of the invention is to improve the operation margin of a master-slave flip-flop circuit.

According to the invention, there is provided a combination of a master-slave flip-flop circuit and a clock control circuit, in which the master-slave flip-flop circuit comprises a master circuit switching element turned on and off under control of a first clock signal for transfer and holding of input data and a slave circuit switching element turned on and off under control of a second clock signal for transfer and holding of data in the master circuit, and the clock control circuit provides the master-slave flip-flop circuit with the first clock signal and the second clock signal, the first clock signal being inverter and said another inverter delayed behind the second clock signal.

DETAILED DESCRIPTION OF THE EMBODIMENT

Figure 1:
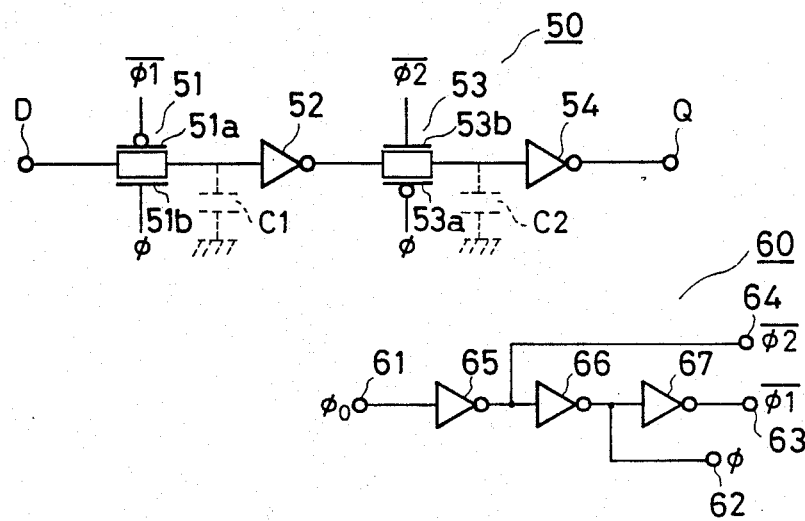
FIGS. 1A and 1B are circuit diagrams respectively showing a flip-flop circuit and a clock control circuit according to an embodiment of the invention.

Referring now more particularly of FIG. 1, there is shown an embodiment of the invention. It comprises a master-slave flip-flop circuit 50 performing dynamic operations and a clock control circuit 60 for driving the master-slave flip-flop circuit 50.

The master-slave flip-flop circuit 50 comprises a data input terminal D and a data output terminal Q. Connected to the data input terminal D is a first main terminal (input/output terminal) of a master circuit switching element, e.g., transfer gate 51, a second main terminal of which is connected to an input terminal of an inverter 52. An output terminal of the inverter 52 is connected to a first main terminal of a slave circuit switching element, e.g., transfer gate 53, a second main terminal of which is connected to an input terminal of an inverter 54. An output terminal of the inverter 54 is connected to the output terminal Q. A parasitic capacitor C1 present at the node between the second main terminal of the master circuit transfer gate 51 and the input terminal of the inverter 52 serves as a data holding element of the master circuit to hold data. A parasitic capacitor C2 present at the node between the second main terminal of the slave circuit transfer gate 53 and the input terminal of the inverter 54 serves as a data holding element of the slave circuit to hold data.

Figure 2:
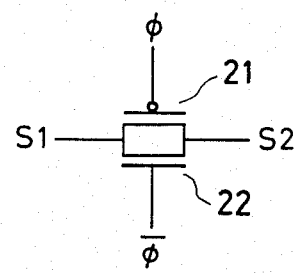
FIG. 2 shows an example of a transfer gate.

Each of the transfer gates 51, 53 is a bidirectional switch formed of CMOS (complementary metal-oxide-silicon field effect-transistor circuit), and is constructed as shown in FIG. 2. As illustrated, it comprises an n-channel MOSFET 22 and a p-channel MOSFET 21 connected in parallel with each other. Because the MOSFETs are in parallel with each other, when one of them is conductive, the transfer gate as a whole is conductive. An advantage of having two MOSFETS of different channel types connected in parallel is that it is possible to fully transfer the input potential to the output irrespective of whether the potential to be transferred is high or low.

In this embodiment, a common clock signal $\phi$ supplied from a clock control circuit 60, a first clock signal which is an inverted clock signal, $\overline{\phi}1$, and a second clock signal which is also an inverted clock signal, $\overline{\phi}2$ are used to turn on and off the transfer gates 51 and 53.

The master circuit transfer gate 51 comprises a PMOS 51a and an NMOS 51b connected in parallel with each other. Applied to the gate electrode of the PMOS 51a is the inverted clock signal $\overline{\phi}1$. Applied to the gate electrode of the NMOS 51b is the clock signal $\phi$. The slave circuit transfer gate 53 comprises a PMOS 53a and an NMOS 53b. Applied to the gate electrode of the PMOS 53a is the clock signal $\phi$. Applied to the gate electrode of the NMOS 53b is the inverted clock signal $\overline{\phi}2$.

The inverters 52 and 53 are circuits which invert their input. There is an inherent delay between transition in the input and a corresponding transition in the output.

Figure 3:
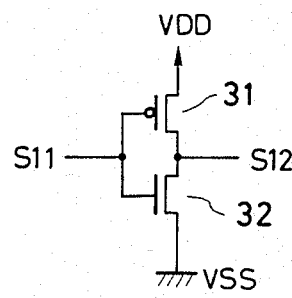
FIG. 3 shows an example of an inverter.

An example of an inverter is shown in FIG. 3. As illustrated, the inverter comprises a PMOS and an NMOS connected in series with each other. More specifically, the illustrated inverter comprises a PMOS 31 having its source electrode connected to a power supply terminal $V_{DD}$ and an NMOS 32 having its drain electrode connected to the drain electrode of the PMOS 31 and having its source electrode connected to the ground terminal $V_{SS}$. The gate electrodes of the PMOS 31 and the NMOS 32 are connected to each other. Responsive to an input signal S11 applied to the gate electrodes, an inverted signal S12 is output at the drain electrodes.

The clock control circuit 60 shown in FIG. 1 comprises three cascaded inverters 65, 66, and 67. The circuit 60 has an input terminal 61 receiving a reference clock signal $\phi0$ distributed from a clock generator, not shown. The clock control circuit 60 also has an output terminal 62 for outputting a clock signal $\phi$ used for both of the transfer gates, another output terminal 63 for outputting the inverted clock signal $\overline{\phi}1$, and a further output terminal 64 for outputting the inverted clock signal $\overline{\phi}2$. Connected to the input terminal 61 is an input terminal of the first-stage inverter 65. The output terminal of the first-stage inverter 65 is connected to the input terminal of the second-stage inverter 66 and to the output terminal 64. Connected to the output terminal of the second-stage inverter 66 are the input terminal of the third-stage inverter 67 and the output terminal 63. Each of the inverters 65, 66 and 67 may have a structure such as that shown in FIG. 3.

Figure 4:
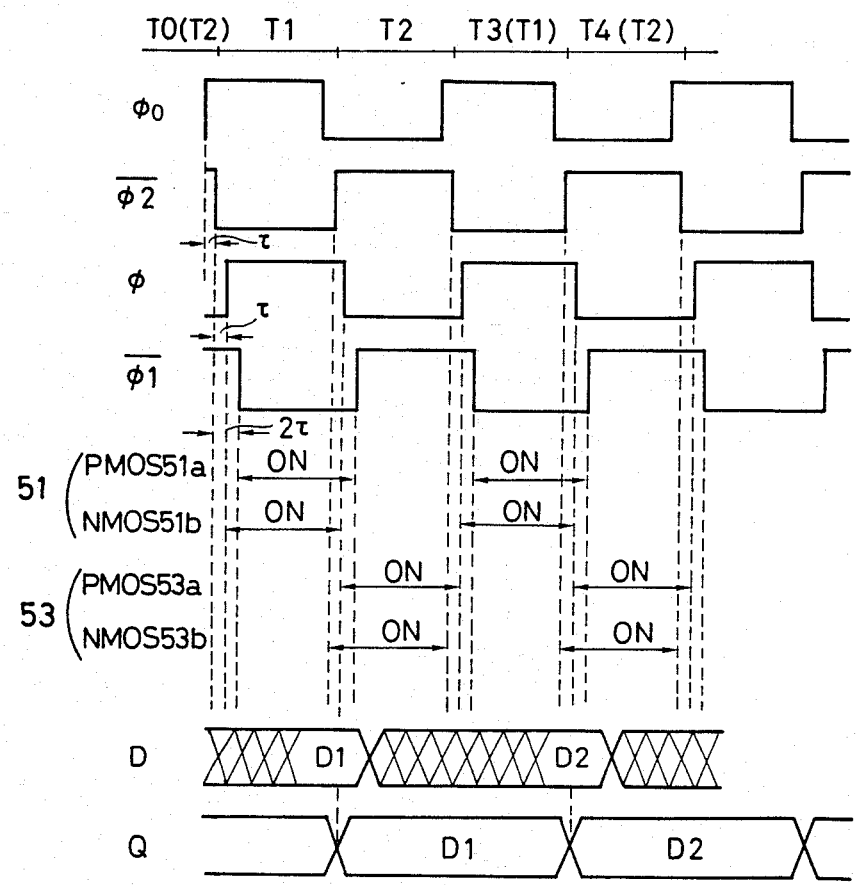
FIG. 4 is a time chart showing an operation of the embodiment of FIG. 1.

Operation of the circuit shown in FIG. 1 will now be described with reference to FIG. 4.

The reference clock signal $\phi0$ distributed from a clock generator (not shown) rises to a height "H" a little before the end of an interval T0 and falls to a height "L" a little before the end of an interval T1. It then rises to the height "H" a little before an end of an interval T2. Similar rising and falling of the signal is repeated during the subsequent intervals T3, T4, and so on. As this clock signal $\phi0$ is supplied to the input terminal 61 of the clock control circuit 60, the clock signal $\phi0$ is inverted by the inverter 65, and the inverted clock signal $\overline{\phi}2$ is supplied to the inverter 66 and is also output through the output terminal 64. The inverted clock signal $\overline{\phi}2$ is delayed by delay time $\tau$ with respect to the clock signal $\phi0$: it falls to a height "L" in interval T1 rises to the height "H", during interval T2, falls during T3, rises during T4, and so on. The inverter clock signal $\overline{\phi}2$ is inverted again by the inverter 66 with a time delay $\tau$, and is supplied as a clock signal $\phi$ to the inverter 67 and is also output through the output terminal 62. The clock signal $\phi$ is inverted by the inverter 67 with the delay time $\tau$ and output as the inverted clock signal $\phi1$ through the output terminal 63. The inverted clock signal $\overline{\phi}1$ has nearly the same phase as the clock signal $\overline{\phi}2$ but is delayed by the delay time $\tau$. When the clock signal $\phi$ and the inverted clock signals $\overline{\phi}1$ and $\overline{\phi}2$ are supplied to the transfer gates 51 and 53, the flip-flop circuit 50 operates in the following manner.

If at about the beginning of interval T1, the clock signal $\phi$ rises to the height "H" and the inverted clock signal $\overline{\phi}1$ falls to the height "L" with a further delay $\tau$, the master circuit transfer gate 51 is turned on, through which data on the data input terminal D is thereby passed and taken in and held at the parasitic capacitor C1. The data at the end of interval T1 which is taken in is referred to as D1. At about the beginning of the interval T2, the inverter clock signal $\overline{\phi}2$ rises to the height "H" and the clock signal $\phi$ falls to the height "L" after the delay time $\tau$, and then the inverter clock signal $\overline{\phi}1$ rises to the height "H" after the delay time $\tau$. Therefore, the slave circuit transfer gate 53 is turned on, and then master circuit transfer gate is turned off. When the slave circuit transfer gate 53 is on, the input data D1 taken in at the end of interval T1 is passed through the inverter 54 to the output terminal Q. It is also held at the parasitic capacitor C2.

At about the beginning of the interval T3, the inverted clock signal $\overline{\phi}2$ falls to the height "L" and clock signal $\phi$ goes the height "H" after the delay time $\tau$. The slave circuit transfer gate 53 is the completely off, and the NMOS 51b of the master circuit transfer gate 51 is turned on. After a further delay of $\tau$, the inverted clock signal $\overline{\phi}1$ goes the height "L" and the NMOS 51b and the PMOS 51a of the master circuit transfer gate 5 are both turned on.

Thus at about the beginning of the interval T3 the master circuit transfer gate 51 is turned on after the slave circuit transfer gate 53 is turned off. In other words, the master circuit transfer gate 51 and the slave circuit transfer gate 53 are not on at the same time. The data D1 held on the parasitic capacitance C2 is therefore not rewritten but maintained.

Also during the interval T3, when the master circuit transfer gate 51 is on, new data is passed through the conducting transfer gate 51. The new data D2 at the end is stored on the parasitic capacitance C1.

During the interval T4, the inverted clock signal $\overline{\phi}2$ goes to the height "H". After the delay time $\tau$, the clock signal $\phi$ goes to the height "L". The slave circuit transfer gate 53 is turned on. After a further delay $\tau$, the inverted clock signal $\overline{\phi}1$ goes to the to the height "H", then the master circuit transfer gate 51 is turned off. The data D2 taken in during interval T3 is output through the conducting slave circuit transfer gate 53 and the inverter 54 to the data output terminal Q.

Similar operations are thereafter repeated.

During the transition from interval T1 to interval T2, the master circuit transfer gate 51 and the slave circuit transfer gate 53 are on at the same time. But this occurs at the time when the data on the parasitic capacitance C2 should be rewritten and presents no problem. Rather it is advantageous that such simultaneous conduction ensures rewriting of the data.

In the above embodiment, the three inverters 65, 66 and 67 are cascaded to form the clock control circuit 60, from which the inverted clock signal $\overline{\phi}2$ and another inverted clock signal $\overline{\phi}1$ delayed by delay time $2\tau$ are produced. By use of these inverted clock signals $\overline{\phi}2$ and $\overline{\phi}1$, operation of the master circuit transfer gate 51 is retarded a little behind operation of the slave circuit transfer gate 53. Erroneous operation of the flip-flop 50 can therefore be prevented. Moreover, since the transfer gate 60 is formed of inverters, the clock control circuit 60 can provide a wide operation margin under any environmental conditions. The driving power is also prevented from dropping. Accordingly, the volume or amount of hardware can be minimized.

The present invention is not limited to the embodiment described above.

For instance, the clock control circuit 60 may be formed of four or more cascaded inverters, rather than three as in the embodiment shown in FIG. 1A.

Moreover, the flip-flop circuit 50 may be other than a dynamic circuit, and may alternatively be a static circuit, or a semi-static circuit.

Figure 5:
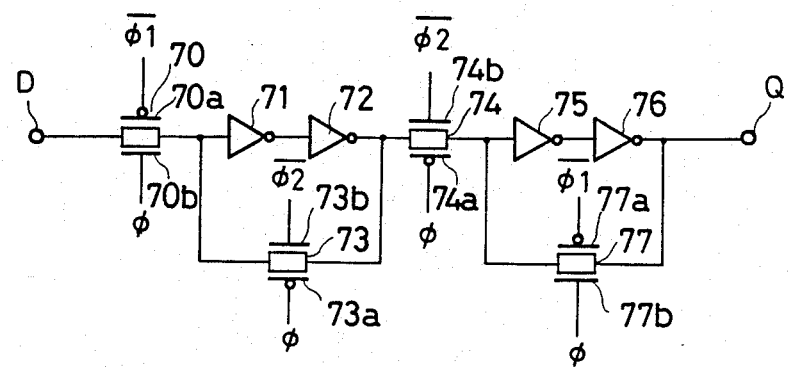
FIG. 5 is a circuit diagram showing a static flip-flop circuit of another embodiment of the invention.

An example of a static flip-flop circuit is shown in FIG. 5. As shown, this static flip-flop circuit includes a data input terminal D and a data output terminal Q. Connected to the data input terminal D is a transfer gate 70 for data input control. Connected to the transfer gate to is a master circuit data holding circuit comprised of inverters 71 and 72 and a transfer gate 73 for data holding control by which a closed loop is formed. A transfer gate 74 transfer data from the master circuit to a slave circuit data holding circuit, which is comprised of inverters 75 and 76 and a transfer gate 77 for data holding control by which a closed loop is formed. The slave circuit is connected to the output terminal Q.

The master circuit transfer gate 73 transfers the input data to the master circuit data holding circuit which maintains the data by the closed loop formed by the conducting transfer gate 73. The slave circuit transfer gate 77 transfers the data maintained in the master circuit data holding circuit to the slave circuit data holding circuit which maintains the data by the closed loop formed by the conducting transfer gate 77.

The transfer gates 70, 73, 74 and 77 are comprised respectively of PMOS's 70a, 73a, 74a and 77a, and NOMS's 70b, 73b, 74b and 77b, which are connected in parallel with each other. Applied to the NOMS's 73b and 74b of the transfer gates 73 and 74 is the inverted clock signal $\bar{\phi}2$ shown in FIG. 1B. Applied to the PMOS's 70a and 77a of the transfer gates 70 and 77 is the inverted clock signal $\bar{\phi}1$. Then results similar to those in the case of FIG. 1A are obtained.

Figure 6:
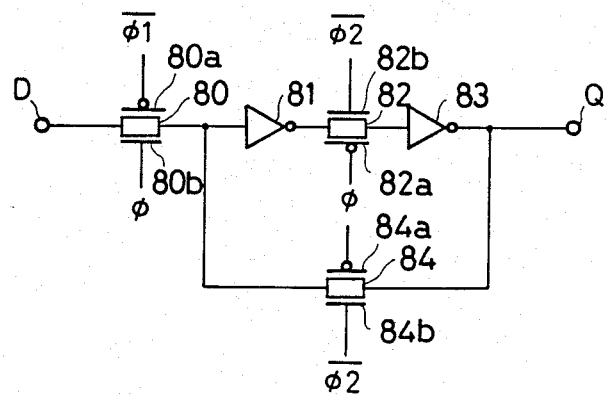
FIG. 6 is a circuit diagram showing a semi-static flip-flop circuit of a further embodiment of the invention.

An example of a semi-static flip-flop circuit is shown in FIG. 6. Connected to the data input terminal D is a transfer gate 80 for data input control. Connected to the transfer gate 80 for an inverter 81, a transfer gate 82, an inverter 83 and a transfer gate 84 forming a closed loop. The closed loop is connected to the output terminal Q. The closed loop has the function of maintaining the input data that has been taken in, by means of conducting transfer gates 82 and 84.

The transfer gates 80, 82 and 84 are respectively comprised of PMOS's 80a, 82a and 84a and NMOS's 80b, 82b, and 84a which are connected in parallel with each other. Applied to the NMOS's 82b and 84b of the transfer gates 82 and 84 is the inverted clock signal $\bar{\phi}2$ shown in FIG. 1B, and applied to the PMOS 80a of transfer gate 80 is the inverted clock signal $\bar{\phi}1$ shown in FIG. 1B. Results similar to those in the case of FIG. 1A are obtained.

What is claimed is:

1. A master-slave flip-flop circuit comprising:
an input terminal and an output terminal;
a master circuit switching means;
a master circuit data holding means;
said master circuit switching means being controlled by a first clock signal for controlling transfer of data from said input terminal to said master circuit data holding means,
said master circuit data holding means holding data transferred through said master circuit switching means;
a slave circuit switching means;
a slave circuit data holding means;
said slave circuit switching means being controlled by a second clock signal for controlling transfer of data from said master circuit data holding means to said slave circuit data holding means;
said slave circuit data holding means holding data transferred through said slave circuit switching means;
said first clock signal being nearly in phase with and lagging a little behind said second clock signal;
said master circuit switching means comprising a transfer gate formed of a p-channel MOS FET and an n-channel MOS FET connected in parallel with each other, and said slave circuit switching means comprising a transfer gate formed of a p-channel MOS FET and an n-channel MOS FET connected in parallel with each other;
said p-channel MOS FET of said master circuit switching means receiving said first clock signal;
said n-channel MOS FET of said slave circuit switching means receiving at its gate electrode said second clock signal; and
said n-channel MOS FET of said master circuit switching means and said p-channel MOS FET of said slave circuit switching means receiving at their gate electrodes a third clock signal lagging behind said second clock signal and leading said first clock signal.

2. A circuit according to claim 1, wherein said third clock signal is nearly in opposite phase to said first and second clock signals.

3. A circuit according to claim 1, wherein said master circuit data holding circuit comprising a capacitor means and an inverter, and said slave circuit data holding means comprises another capacitor means an another inverter.

4. A circuit according to claim 3, wherein each of said inverter and said another inverter comprises a series connection of a p-channel MOS FET and an n-channel MOS FET.

5. A combination of a master-slave flip-flop circuit and a clock control circuit, wherein said master-slave flip-flop circuit comprises:
an input terminal and an output terminal,
a master circuit switching means;
a master circuit data holding means;
said master circuit switching means being controlled by a first clock signal for controlling transfer of data from said input terminal to said master circuit data holding means,
said master circuit data holding means holding data transferred through said master circuit switching means;
a slave circuit switching means;
a slave circuit data holding means;
said slave circuit switching means being controlled by a second clock signal for controlling transfer of data from said master circuit data holding means to said slave circuit data holding means;
said slave circuit data holding means holding data transferred through said slave circuit switching means;
said first clock signal being nearly in phase with and lagging a little behind said second clock signal;

said clock control circuit comprising a cascade connection of inverters arranged to produce said first and second clock signals;

said cascade connection of inverters comprising a first inverter having an input and an output and a second inverter receiving said output of said first inverter and having an output, said first clock signal being derived from said output of said second inverter, and said second clock signal being derived from said input of said first inverter;

said master circuit switching means comprising a transfer gate formed of a p-channel MOS FET and an n-channel MOS FET connected in parallel with each other; and said slave circuit switching means comprising a transfer gate formed of a p-channel MOS FET and an n-channel MOS FET connected in parallel with each other;

said p-channel MOS FET of said master circuit switching means receiving said first clock signal;

said n-channel MOS FET of said slave circuit switching means receiving said second clock signal;

said n-channel MOS FET of said master circuit switching means and said p-channel MOS FET of said slave circuit switching means receiving at their respective gate electrodes a third clock signal lagging behind said second clock signal and leading said first clock signal; and said third clock signal being derived from said output of said first inverter of said cascade connection.

6. A combination according to claim 5, wherein said cascade connection further comprises a third inverter for receiving a distributed reference clock signal, said first inverter being responsive to signals from said third inverter.

7. A combination according to claim 5, wherein said third clock signal is nearly in opposite phase to said first and second clock signals.

8. A combination according to claim 5, wherein said master circuit data holding means comprises a capacitor means and an inverter, and said slave circuit data holding means comprises another capacitor means and another inverter.

9. A combination according to claim 8, wherein each of said inverter and said another inverter comprises a series connection of a p-channel MOS FET and an n-channel MOS FET.

10. A combination of a master-slave flip-flop circuit and a clock control circuit, wherein said master-slave flip-flop circuit comprises:

an input terminal and an output terminal, a master circuit switching means;

a master circuit data holding means;

said master circuit switching means being controlled by a first clock signal for controlling transfer of data from said input terminal to said master circuit data holding means, said master circuit data holding means holding data transferred through said master circuit switching means;

a slave circuit switching means;

a slave circuit data holding means;

said slave circuit switching means being controlled by a second clock signal for controlling transfer of data from said master circuit data holding means to said slave circuit data holding means;

said slave circuit data holding means holding data transferred through said slave circuit switching means;

said first clock signal being nearly in phase with and lagging a little behind said second clock signal;

said clock control circuit comprising a cascade connection of inverters arranged to produce said first and second clock signals;

said master circuit switching means comprising a transfer gate formed of a p-channel MOS FET and an n-channel MOS FET connected in parallel with each other; and said slave circuit switching means comprising a transfer gate formed of a p-channel MOS FET and an n-channel MOS FET connected in parallel with each other;

said p-channel MOS FET of said master circuit switching means receiving said first clock signal;

said n-channel MOS FET of said slave circuit switching means receiving said second clock signal;

said n-channel MOS FET of said master circuit switching means and said p-channel MOS FET of said slave circuit switching means receiving at their respective gate electrodes a third clock signal lagging behind said second clock signal and leading said first clock signal;

said third clock signal being derived from an output of a first inverter of said cascade connection; and wherein said third clock signal is nearly in opposite phase to said first and second clock signals.

* * * * *